US010247799B2

(12) United States Patent
Sun (10) Patent No.: US 10,247,799 B2
(45) Date of Patent: Apr. 2, 2019

(54) SYSTEM AND METHOD FOR SENSITIVITY-ENHANCED MULTI-ECHO CHEMICAL EXCHANGE SATURATION TRANSFER (MECEST) MAGENTIC RESONANCE IMAGING

(71) Applicant: THE GENERAL HOSPITAL CORPORATION, Boston, MA (US)

(72) Inventor: Phillip Zhe Sun, Waltham, MA (US)

(73) Assignee: The General Hospital Corporation, Boston, MA (US)

( * ) Notice: Subject to any disclaimer, the term of this patent is extended or adjusted under 35 U.S.C. 154(b) by 754 days.

(21) Appl. No.: 14/652,904

(22) PCT Filed: Dec. 10, 2013

(86) PCT No.: PCT/US2013/074002
§ 371 (c)(1),
(2) Date: Jun. 17, 2015

(87) PCT Pub. No.: WO2014/099463
PCT Pub. Date: Jun. 26, 2014

(65) Prior Publication Data
US 2015/0338483 A1 Nov. 26, 2015

Related U.S. Application Data

(60) Provisional application No. 61/738,750, filed on Dec. 18, 2012.

(51) Int. Cl.
*G01R 33/36* (2006.01)
*G01R 33/50* (2006.01)
(Continued)

(52) U.S. Cl.
CPC ......... *G01R 33/50* (2013.01); *G01R 33/1284* (2013.01); *G01R 33/4828* (2013.01);
(Continued)

(58) Field of Classification Search
CPC .................. G01R 33/54; G01R 33/56
(Continued)

(56) References Cited

U.S. PATENT DOCUMENTS 8,278,925 B2 * 10/2012 Sun ..................... G01R 33/4828
324/307
2005/0134262 A1 * 6/2005 Clarke ............... G01R 33/0356
324/301

(Continued)

OTHER PUBLICATIONS

International Search Report and Written Opinion dated Apr. 3, 2014 for International Application No. PCT/US2013/074002.

(Continued)

*Primary Examiner* — Patrick Assouad
*Assistant Examiner* — Taqi Nasir
(74) *Attorney, Agent, or Firm* — Quarles & Brady LLP (57) ABSTRACT

A system and method for creating magnetic resonance images includes performing a first pulse sequence that saturates a selected labile spin species of the subject by applying a radiofrequency (RF) irradiation at a reference frequency and performing a second pulse sequence that saturates a selected labile spin species of the subject by applying an RF irradiation at a labeling frequency. A plurality of echoes having information pertaining to at least one of metabolites and metabolite byproducts is acquired to form a chemical exchange saturation transfer (CEST) medical imaging data set and the CEST medical imaging data set is reconstructed to form a CEST image of the subject including information about the at least one of metabolites and metabolite byproducts within the subject.

14 Claims, 9 Drawing Sheets (51) Int. Cl.
*G01R 33/12* (2006.01)
*G01R 33/48* (2006.01)
*G01R 33/56* (2006.01)
G01R 33/465 (2006.01)
G01R 33/483 (2006.01)
G01R 33/561 (2006.01)

(52) U.S. Cl.
CPC ........ *G01R 33/5605* (2013.01); *G01R 33/465* (2013.01); *G01R 33/4838* (2013.01); *G01R 33/5618* (2013.01)

(58) Field of Classification Search
USPC ....... 324/309, 301, 302, 304, 300, 322, 319, 324/318, 315
See application file for complete search history.

(56) References Cited

U.S. PATENT DOCUMENTS

| | | | | |
|---|---|---|---|---|
| 2007/0182409 A1* | 8/2007 | Varjo | ................. | G01R 33/3415 324/304 |
| 2010/0026297 A1* | 2/2010 | Sun | ................... | G01R 33/4828 324/309 |
| 2010/0201357 A1* | 8/2010 | Ogawa | ................... | G01N 24/08 324/301 |
| 2010/0286502 A1 | 11/2010 | Van Zijl et al. | | |
| 2011/0025323 A1* | 2/2011 | Budker | ................. | G01R 33/26 324/304 |
| 2011/0152671 A1 | 6/2011 | Aime et al. | | |
| 2012/0126808 A1* | 5/2012 | Knopp | ................. | A61B 5/0515 324/301 |
| 2013/0022548 A1* | 1/2013 | Bennett | ................. | A61K 49/12 424/9.3 |
| 2013/0193963 A1* | 8/2013 | Smith | ................. | G01R 33/323 324/301 |
| 2013/0280173 A1* | 10/2013 | Neeman | ................ | A61K 49/14 424/9.34 |
| 2013/0289663 A1* | 10/2013 | Newman | ................ | A61N 1/08 607/62 |

OTHER PUBLICATIONS

Keupp, J. et al., CEST-Dixon MRI for Sensitive and Accurate Measurement of Amide Proton Transfer in Humans at 3T. Proc. Intl. Soc. Mag. Reson. Med. 18 (2010), p. 338.

\* cited by examiner

CESTR
FIG. 9B

CESTR
FIG. 9C

SYSTEM AND METHOD FOR SENSITIVITY-ENHANCED MULTI-ECHO CHEMICAL EXCHANGE SATURATION TRANSFER (MECEST) MAGENTIC RESONANCE IMAGING

CROSS-REFERENCE TO RELATED APPLICATIONS

This application represents the U.S. National Stage of International Application No. PCT/US2013/074002, filed Dec. 10, 2013 which is based on, claims the benefit of, and incorporates herein by reference in its entirety, U.S. Provisional Application Ser. No. 61/738,750, filed Dec. 18, 2012, and entitled, "SYSTEM AND METHOD FOR SENSITIVITY-ENHANCED MULTI-ECHO CHEMICAL EXCHANGE SATURATION TRANSFER (MECEST) MAGNETIC RESONANCE IMAGING."

STATEMENT REGARDING FEDERALLY SPONSORED RESEARCH

This invention was made with government support under grant number EB009771 awarded by the National Institutes of Health. The government has certain rights in this invention.

BACKGROUND OF THE INVENTION

The field of the invention is magnetic resonance imaging (MRI) methods and systems. More particularly, the invention relates to a system and method for chemical exchange saturation transfer MRI having improved sensitivity.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear", or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Molecular imaging includes a variety of imaging modalities and employs techniques that detect molecular events such as cell signaling, gene expression, and pathologic biomarkers. These techniques seek to achieve early detection of diseases, better management of therapy treatment, and improved monitoring of cancer recurrence. MRI provides specific advantages for molecular imaging applications, due to its noninvasive nature. Traditional molecular MRI techniques rely on the administration of a contrast agent to a designated location within a subject. Oftentimes, a site-specific contrast agent is employed that interacts with a given molecule of interest. These conventional techniques, however, exhibit poor sensitivity, making the detection of the contrast agents difficult. This is especially true when imaging the brain, which has a natural barrier to exogenous chemicals.

Chemical exchange saturation transfer (CEST) serves as a useful tool for molecular MRI. The CEST imaging method offers various advantages over traditional molecular MRI techniques. First, in some cases, the molecules of interest within the subject can be directly detected. This feature mitigates the need for administering contrast agents to the subject. Second, the image contrast mechanism can be controlled with the RF pulses produced by the MRI system and, as such, can be turned on and off when desired. This allows the location of specific molecules of interest to be detected by comparing images having the desired contrast present to those where it has been turned off. Lastly, the CEST imaging method is more sensitive than many traditional molecular MRI techniques, making it able to detect substantially low concentrations of given molecules. However, even with this comparatively improved sensitivity, the magnitude of the endogenous CEST effect is typically small, and it is necessary to enhance the CEST imaging sensitivity for routine use.

CEST imaging renders MRI, which usually detects only bulk water signal, sensitive to metabolites and their byproducts, such as glucose, lactate and glutamate. In particular, the chemical exchange between bulk water and amide protons from endogenous proteins and peptides has been shown to be sensitive to ischemic tissue acidosis, and as a result has given rise to an imaging technique referred to as amide proton transfer (APT) imaging. Since tissue pH decreases in response to abnormal glucose/oxygen metabolism during acute ischemia, pH-sensitive APT imaging may serve as a surrogate metabolic imaging marker for stroke. In that it complements perfusion and diffusion MRI, APT imaging may allow better characterization of penumbra for predicting ischemic tissue outcome in acute stroke. Moreover, APT imaging may eventually help guide thromobolytic and/or neuroprotective therapies for acute stroke.

Traditionally, CEST and APT imaging techniques are limited to acquiring single slices of image data. In response to this challenges, multi-slice CEST techniques have been developed, such as described in U.S. Pat. No. 8,278,925, entitled, "Method for relaxation-compensated fast multi-slice chemical exchange saturation transfer MRI," which is incorporated herein by reference in its entirety.

Therefore, CEST continues to develop as an important imaging technique in MRI, however, it would be desirable to have a system and method that is more robust and versatile than traditional CEST-based imaging techniques.

SUMMARY OF THE INVENTION

The present invention overcomes the aforementioned drawbacks by providing a system and method for CEST-based imaging that acquires data across a plurality of echoes. In particular, the present invention recognizes that there are significant residual MR signals after the first echo acquisition in a CEST-based imaging process, such as CEST-based echo planar imaging (EPI). Furthermore, because the control, reference, and label images decay following the same T2 relaxation, when collecting multiple echoes, an asymmetry analysis can be used to correct for the confounding T2 effect, and the obtained CEST effect can be rendered independent of the echo time and T2.

In accordance with one aspect of the invention, a magnetic resonance imaging (MRI) system is disclosed that includes a magnet system configured to generate a polarizing magnetic field about at least a region of interest (ROI) in a subject arranged in the MRI system, a plurality of gradient coils configured to apply a gradient field to the polarizing magnetic field, a radio frequency (RF) system configured to apply an excitation field to the subject and acquire MR image data from a ROI, and a computer system. The computer system is programmed to control the RF system and plurality of gradient coils according to a first pulse sequence that saturates a selected labile spin species of the subject by applying a radiofrequency (RF) irradiation at a reference frequency. The computer system is also programmed to control the RF system and plurality of gradient coils according to a second pulse sequence that saturates a selected labile spin species of the subject by applying an RF irradiation at a labeling frequency and acquire a plurality of echoes having information pertaining to at least one of metabolites and metabolite byproducts within the ROI to form a chemical exchange saturation transfer (CEST) medical imaging data set. The computer system is programmed to reconstruct the CEST medical imaging data set to form a CEST image of the subject including information about the at least one of metabolites and metabolite byproducts within the subject.

In accordance with another aspect of the invention, a method for producing an image of a subject with a magnetic resonance imaging (MRI) system is disclosed that includes a) performing, with the MRI system, a first pulse sequence that saturates a selected labile spin species by applying a radiofrequency (RF) irradiation at a reference frequency and b) acquiring, with the MRI system and after completion of step a), reference image data. The method also includes c) performing, with the MRI system, a second pulse sequence that saturates a selected labile spin species by applying an RF irradiation at a labeling frequency and d) acquiring, with the MRI system and after step c), a plurality of echoes to form labeled image data. The method further includes e) reconstructing a reference image from the reference image data and a labeled image from the labeled image data and f) producing a corrected ratio image by subtracting the reconstructed labeled images from the reference images.

In accordance with yet another aspect of the invention, a method for producing an image of a subject with a magnetic resonance imaging (MRI) system is disclosed that includes a) acquiring, with the MRI system, T1 measurement data, b) producing a T1 map from the acquired T1 measurement data, and c) acquiring, with the MRI system, reference image data The method also includes d) acquiring, with the MRI system, labeled image data spanning a plurality of echoes, e) reconstructing a reference image from the reference image data and a labeled image from the labeled image data and f) producing a CEST ratio (CESTR) map by subtracting the labeled image from reference image. The method further includes g) producing a compensated CESTR (cCESTR) map using the CESTR map and T1 map by correcting for longitudinal magnetization relaxation effects on a voxel-by-voxel basis.

In accordance with still another aspect of the invention, a method for producing a report regarding a subject using a magnetic resonance imaging (MRI) system is disclosed that includes performing, with the MRI system, a first pulse sequence that saturates a selected labile spin species of the subject by applying a radiofrequency (RF) irradiation at a reference frequency. The method also includes performing, with the MRI system, a second pulse sequence that saturates a selected labile spin species of the subject by applying an RF irradiation at a labeling frequency, acquiring, with the MRI system, a plurality of echoes having information pertaining to at least one of metabolites and metabolite byproducts within the ROI to form a chemical exchange saturation transfer (CEST) data set, and generating a spectroscopy report from the CEST data set including information about the at least one of metabolites and metabolite byproducts within the subject.

The foregoing and other advantages of the invention will appear from the following description.

DETAILED DESCRIPTION OF THE PREFERRED EMBODIMENT

Figure 1:
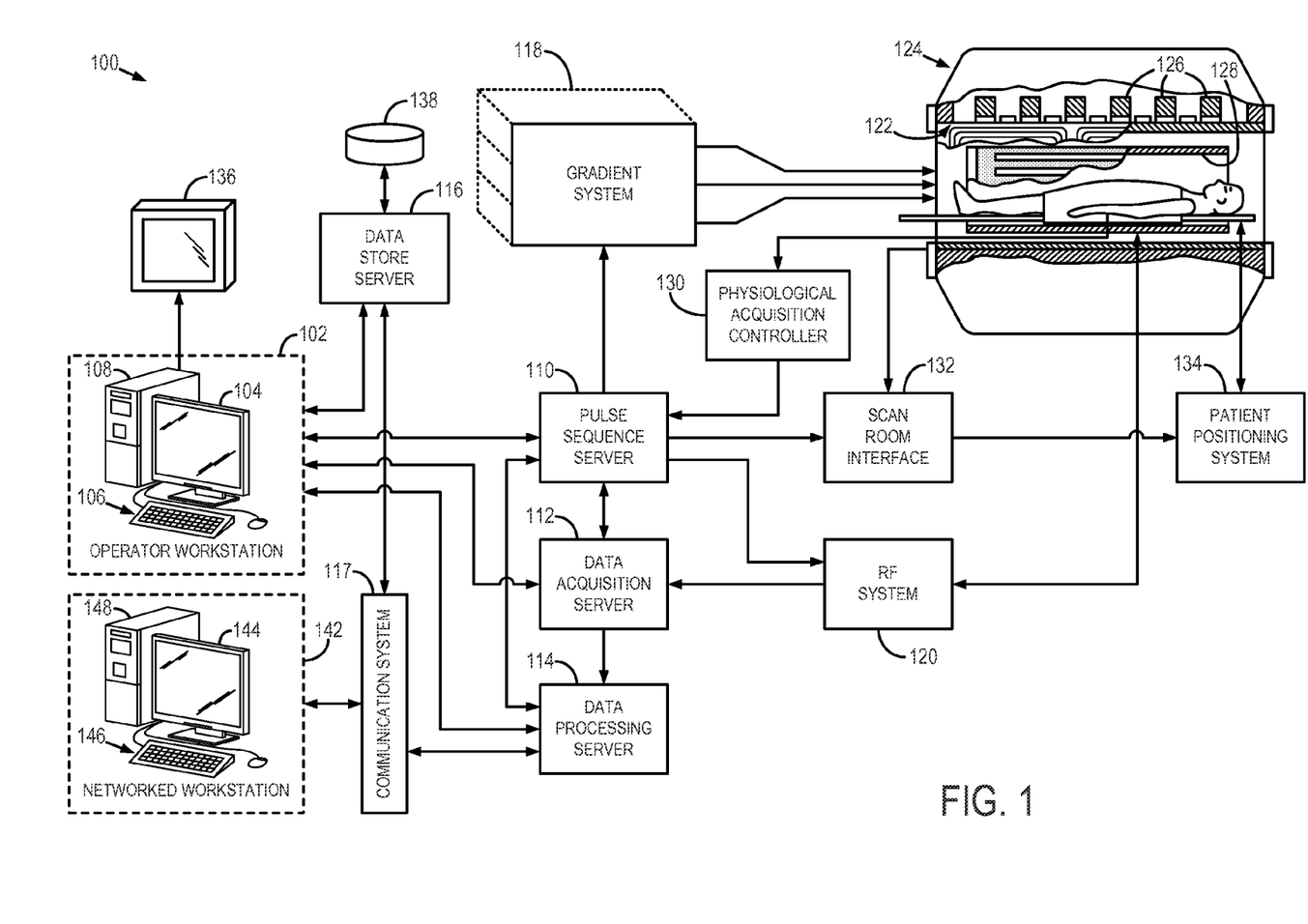
FIG. 1 is a block diagram of an MRI system which employs the present invention.

Referring particularly now to FIG. 1, an example of a magnetic resonance imaging (MRI) system 100 is illustrated. The MRI system 100 includes an operator workstation 102, which will typically include a display 104, one or more input devices 106, such as a keyboard and mouse, and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 117, which may include any suitable network connection, whether wired, wireless, or a combination of both. As an example, the communication system 117 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil (not shown in FIG. 1), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays (not shown in FIG. 1).

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than passing the acquired magnetic resonance data to the data processor server 114.

However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 117. Accordingly, multiple networked workstations 142 may have access to the data processing server 114 and the data store server 116. In this manner, magnetic resonance data, reconstructed images, or other data may exchange between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

As described above, chemical exchange saturation transfer (CEST) imaging is an emerging MRI contrast mechanism that is sensitive to dilute biomolecules, local pH and temperature, and remains promising for in vivo applications. For diamagnetic CEST (DIACEST) agents undergoing slow and intermediate chemical exchange, the CEST effect approaches its steady state exponentially. Hence, the conventional CEST MRI pulse sequence includes long RF irradiation followed by fast image readout. Because the echo planar imaging (EPI) readout duration could be significantly shorter than the typical T2 values in biological tissue, the present invention recognizes that there are significant residual MR signals after the first echo acquisition. However, this was not realized in traditional notions of CEST-EPI and was discarded by the routine CEST-EPI sequence. Because the control, reference, and label images decay following the same T2 relaxation, the asymmetry analysis can correct for the confounding T2 effect, and the obtained CEST effect is independent of the echo time and T2. As will be described, the present invention provides a multi-echo CEST (meCEST) MRI pulse sequence that is a sensitive acquisition strategy for CEST imaging.

To verify the clinical application, a tissue-like creatine-gel pH phantom was created and evaluated with respect to both the magnitude of the CEST effect and pH-sensitive CEST contrast to noise ratio (CNR), as a function of the number of echoes and signal averages. The CEST effect obtained from the meCEST MRI technique of the present invention was shown to be independent of the echo time, and the use of least-squares optimization algorithm provided significant sensitivity enhancement from the conventional single echo CEST MRI sequence, augmenting the emerging applications of CEST imaging.

Figure 2:
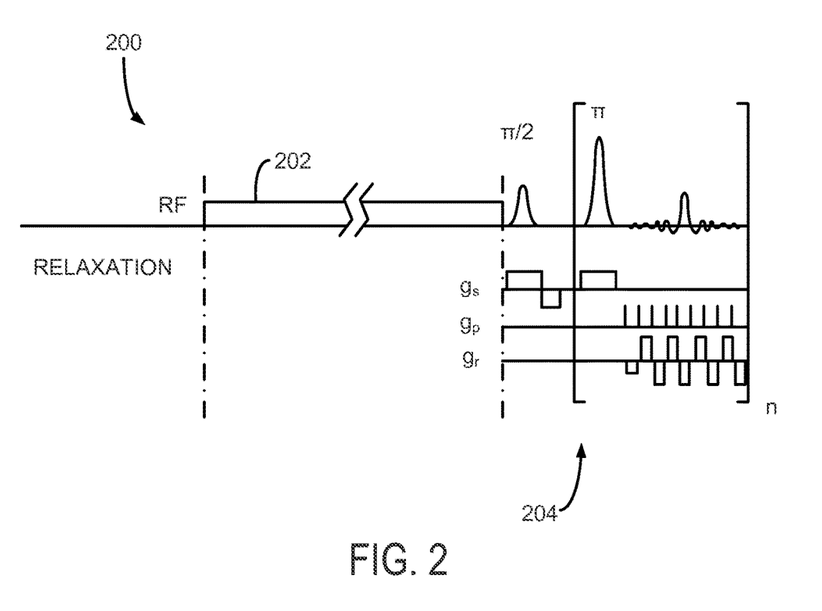
FIG. 2 is a graphic illustration of one pulse sequence for directing the MRI system of FIG. 1 to acquire imaging data in accordance with the present invention.

An example of a meCEST pulse sequence 200 in accordance with the present invention is illustrated in FIG. 2. The present invention may be configured within the context of a single-shot, single-slice EPI pulse sequence, such as illustrated. This can also be combined with variants of EPI sequences, including multi-shot, multi-slice, spiral EPI, and the like. Variations thereon, such as shared k-space (keyhole/TRICKS-type) techniques, acquisitions designed to be utilized with compressed sensing-based techniques, and the like may also be used. Notably, such techniques may be advantageously used when the signal based on the CEST effect is "recycled" using meCEST, which allows the advantageous combination of the speed of, for example, compressed sensing-based techniques with CEST imaging. Specifically, the pulse sequence 200 includes a continuous-wave RF irradiation pulse 202, followed by Carr Purcell Meiboom Gill (CPMG) multi-echo EPI acquisition 204. Note that for slow and intermediate chemical exchange, the RF irradiation 204 may be equivalent to pulsed RF irradiation, instead of the illustrated continuous wave (CW).

Figure 3:
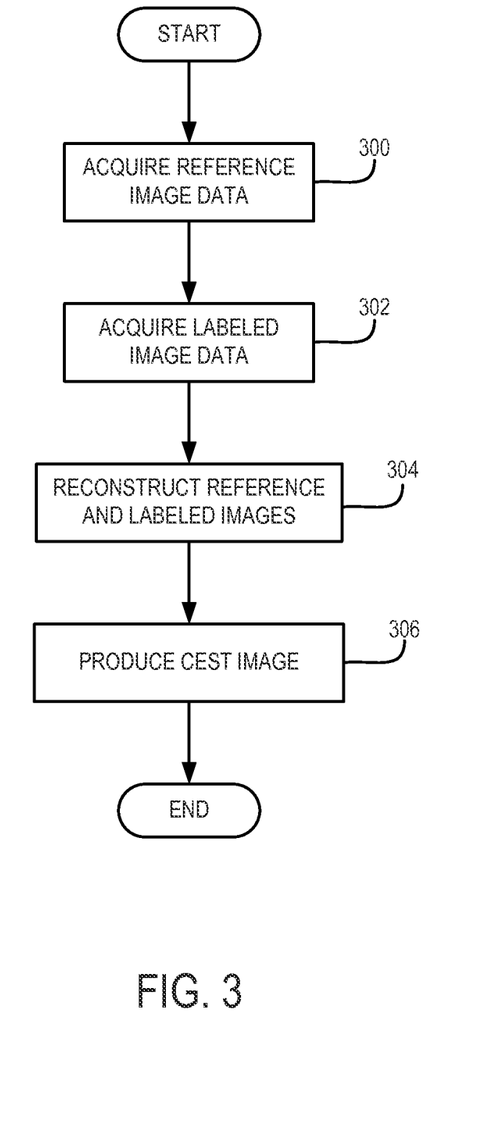
FIG. 3 is a flow chart setting forth the steps of a method in accordance with the present invention.

Referring to FIGS. 2 and 3, a flow chart sets for the steps of a general process in accordance with the present invention. Because the above-described pulse sequence 200 intrinsically compensates for the relaxation-induced loss of CEST contrast it is possible to forego an explicit T2 measurement. Instead, reference image data may acquired in step 300 by performing the imaging pulse sequence 200 with the application of the RF irradiation 202 at a reference frequency, $-\Delta f_s$. Labeled image data are then acquired at step 302 through the performance of the imaging pulse sequence 204, wherein now the RF irradiation 202 and any additional saturation pulse are applied at a labeling frequency, $\Delta f_s$. From these two sets of data, reference and labeled images are reconstructed in step 304. A CESTR image is then produced in step 306. Notably, because the image data was acquired with a multi-echo CEST pulse sequence, such as a Carr Purcell Meiboom Gill (CPMG) multi-echo EPI acquisition, the resulting images, as described below, can be substantially improved, such as having a higher CNR, over traditional CEST images.

For certain applications, CESTR can be calculated, as described above, where CESTR is equal to one less the ratio of the label image to the reference image. However, control images can be collected and an asymmetry analysis used to calculate CESTR as the difference of the reference and label images over the control image.

Since the data acquired with the pulse sequence 200 intrinsically compensates for T2 relaxation-induced losses of the CEST contrast mechanism, no additional compensation must be performed.

A compensated CESTR (cCESTR) map may be produced from the CESTR map and using the $T_1$ map by correcting for longitudinal magnetization relaxation effects on a voxel-by-voxel basis and may be carried out such that:

$$cCESTR(i, j) = CESTR(i, j) \cdot e^{\frac{t}{T_{1w}(i,j)}}, \quad \text{Eqn. 3}$$

where cCESTr(i,j) indicates a voxel value in the compensated CESTR map at voxel location (i,j), CESTr(i,j) indicates the voxel value in the CESTR map at the corresponding voxel location (i,j), and $T_{1w}(i,j)$ indicates the voxel value in the produced $T_1$ map at the corresponding voxel location (i,j). Additionally, t is the duration of time after the RF irradiation at which the signal corresponding to a given image was acquired.

T1-induced loss of CESTR can also be achieved by using segmented RF irradiation scheme (Sun P Z, Cheung J S, Wang E, Benner T, Sorensen A G. Fast multi-slice pH-weighted chemical exchange saturation transfer (CEST) MRI with unevenly segmented RF irradiation. Magn Reson Med 2011; 65(2):588-594).

Figure 4:
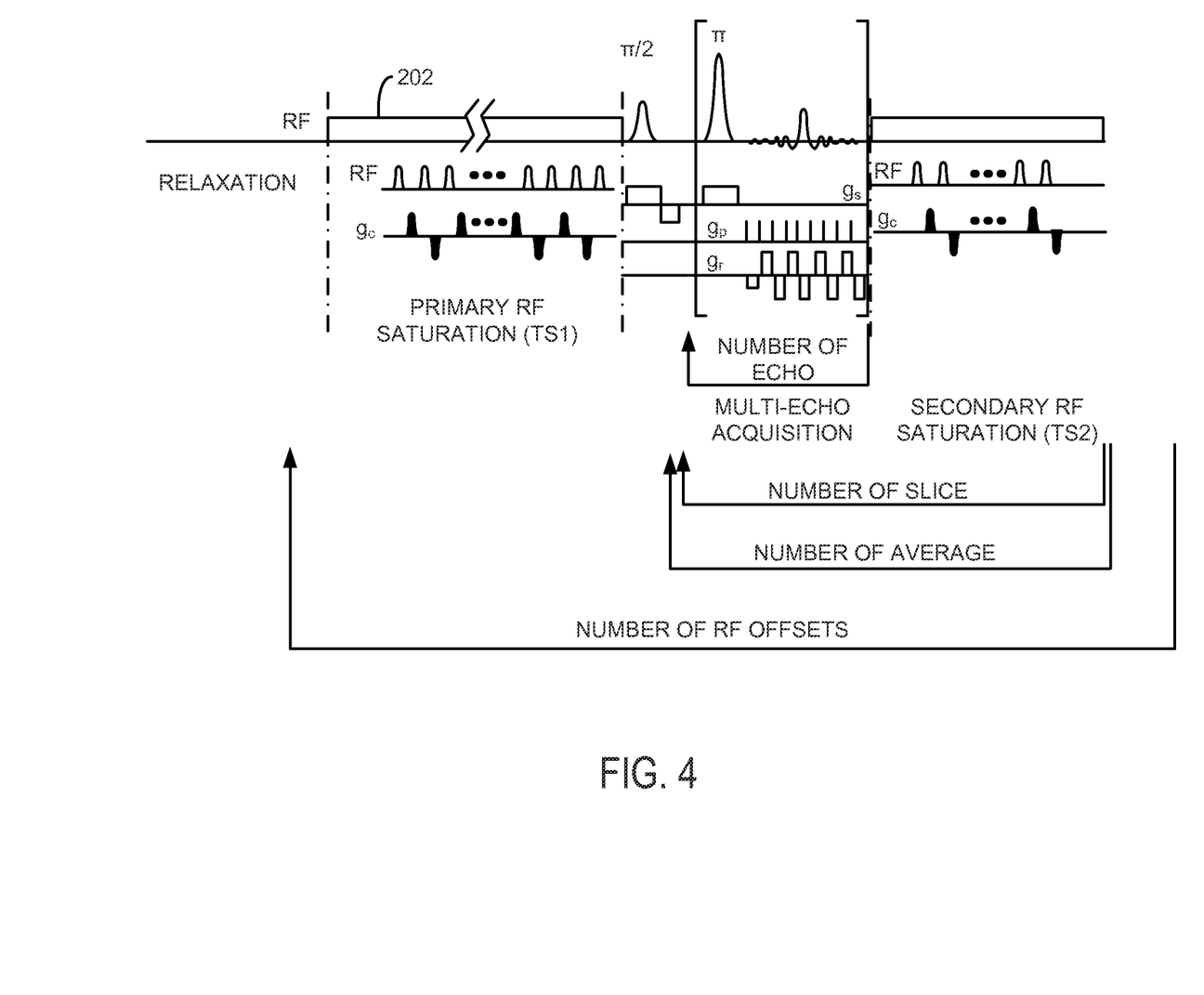
FIG. 4 is a modified sequence diagram with respect to FIG. 2 that combines meCEST MRI with segmented RF irradiation.

By way of example, FIG. 4 provides a pulse sequence diagram modified with respect to FIG. 2 to perform T1-compensated multi-slice meCEST MRI. The process described above with respect to FIG. 3 corrects T2-decay in multi-echo acquisition and, if modified, can correct T1-induced losses of the CEST effect in multi-slice acquisition. Specifically, such losses can be corrected, for example, using T1-compensation such as described in U.S. Pat. No. 8,278,925, which is incorporated herein by reference in its entirety, or use a modified sequence that combines meCEST MRI with segmented RF irradiation, such as illustrated in FIG. 4.

Figure 5:
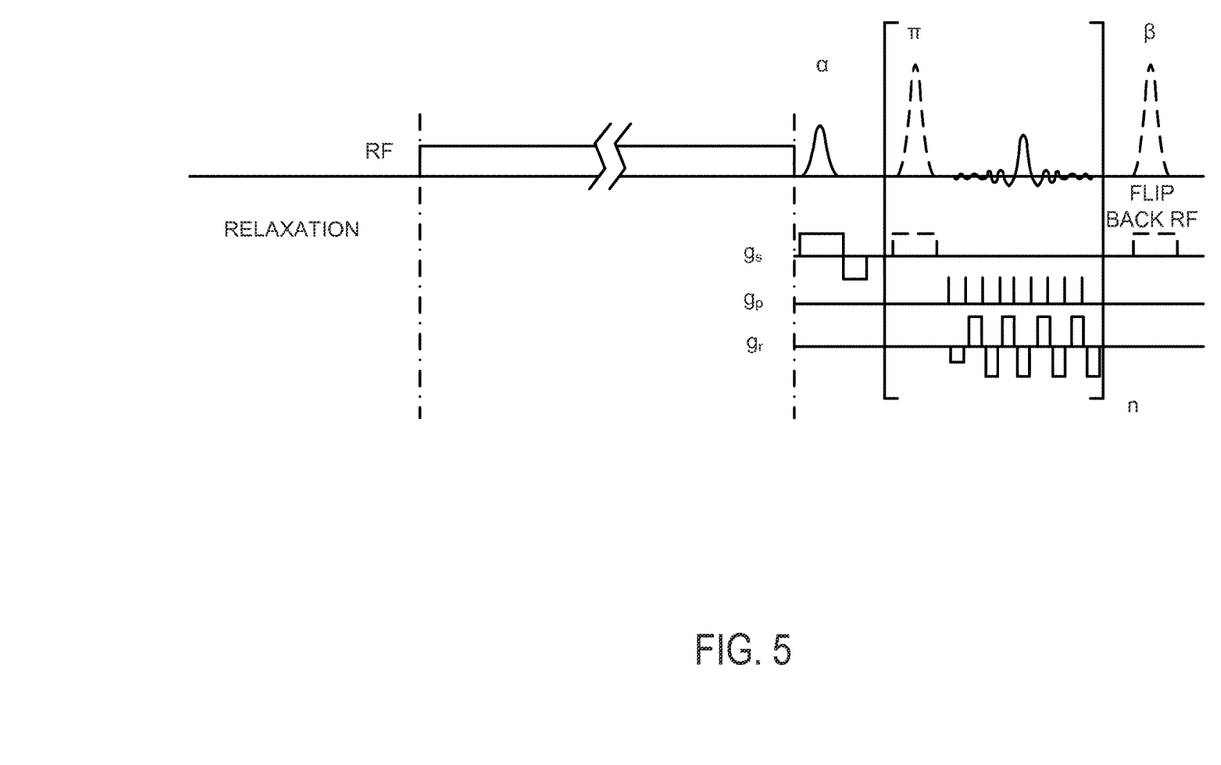
FIG. 5 is a further modified sequence diagram with respect to FIG. 2 that includes a flip-back RF pulse and variants of multi-echo acquisition.
Figure 6:
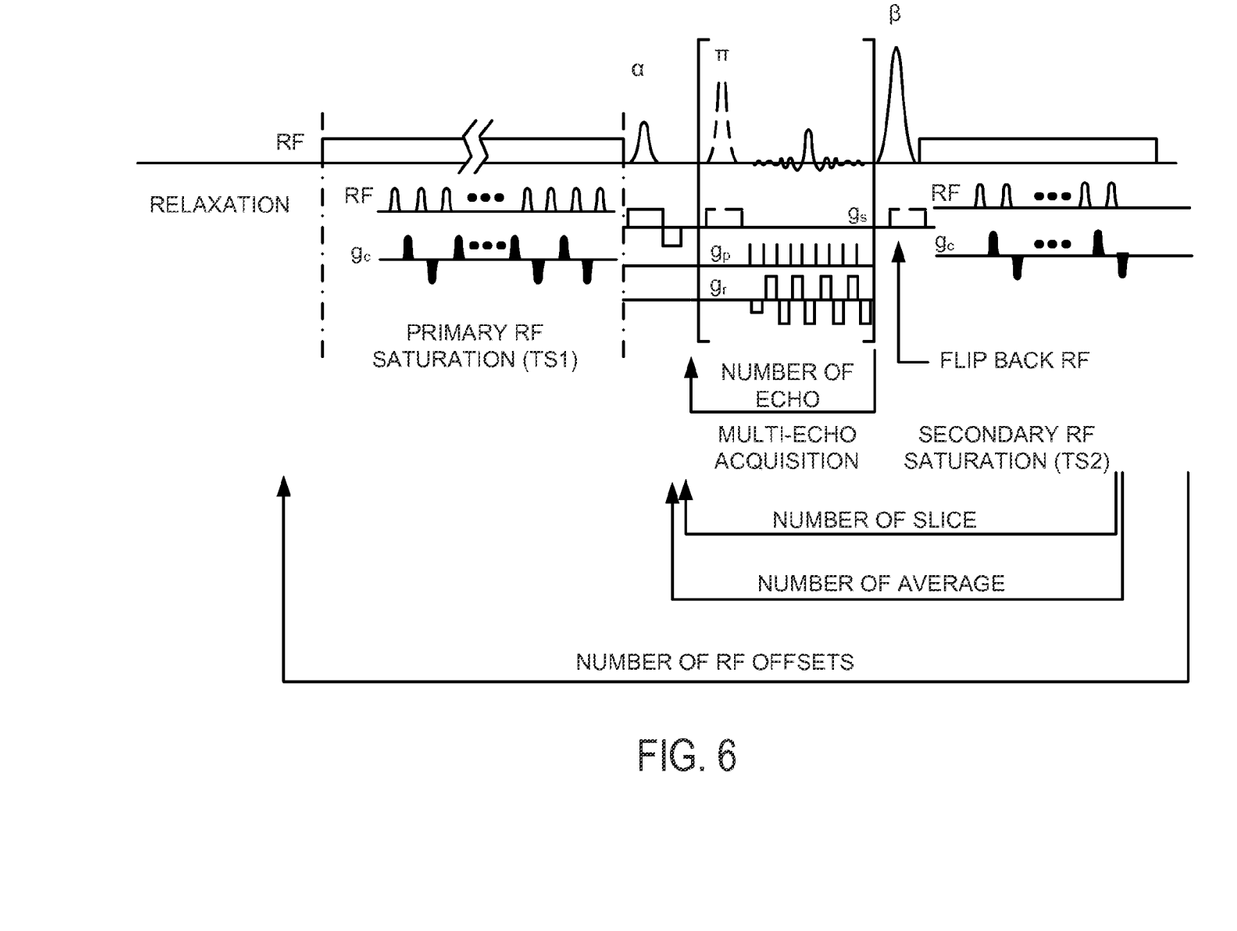
FIG. 6 is a further modified sequence diagram with respect to FIG. 4 that includes a flip-back RF pulse and variants of multi-echo acquisition.

Additional variations or generalizations on FIG. 2 and FIG. 4 are illustrated in FIGS. 5 and 6, respectively. In particular, alpha and beta pulses can, optionally, be used, which may vary in degree. Notably, multi-echo acquisitions can be obtained with gradient echo pulse sequences, spin echo pulse sequences, or a mixture of both. The excitation pulse does not have to be pi/2 for cases where only a few echoes are desired to be acquired. The beta pulse can be used to flip back the residual signal to speed up the spin recovery for the next acquisition. The refocusing pulse is optional and may be omitted, for example, when employing a gradient echo pulse sequence. Also, there are cases where a long train of pi pulse is less desirable, such as high field, high SAR or B1 inhomogeneity. As such, a train of gradient echo or interleaved multi gradient-echo and spin echo acquisition may be useful.

Tests using the above-described pulse sequence, for example, used a slice thickness of 5 mm, a field of view of 50×50 mm, an image matrix of 64×64, and a bandwidth of 225 kHz. Exemplary repetition time (TR) and saturation time (TS) of 10 seconds and 5 seconds, respectively, were used in testing. A B1 of 0.75 µT was also used in testing. In this example, five echoes were obtained with a TE being multiples of 24 ms. CEST experiments were repeated with the number of signal average (NSA) being 1, 2 and 4 times. In addition, T1 and T2 were measured with the conventional single-echo EPI. A T1 map was derived using an inversion recovery sequence with inversion time (TI) from 0.25, 0.75, 1, 2, 3 to 5 s (TR/TE=10 s/23 ms, NSA=2). A T2 map was derived from five separate spin-echo images with TE of 30, 60, 90, 120 and 150 ms (TR=10 s and NSA=2). Moreover, a field mapping was acquired using T2"-weighted MRI (TR=10 s and NSA=2), with the asymmetric echo time shift being 1, 3, 5 and 7 ms.

As described in U.S. Pat. No. 8,278,925, which is incorporated herein by reference in its entirety, CEST effect can be calculated as CEST ratio (CESTR), following the asymmetry analysis CESTR=$(I_{ref}-I_{label})/I_0$, where $I_{label}$ and $I_{ref}$ are label and reference images with RF irradiation applied at labile proton frequency ($\Delta\omega_s$) and reference frequency ($-\Delta\omega_s$), and $I_0$ is the control image. In addition, the pH-sensitive CNR was calculated as:

$$\frac{\Delta CESTR}{\sqrt{(\sigma^2_{pH=6.5} + \sigma^2_{pH=6.0})/2}}; \quad \text{Eqn. 4}$$

where ΔCESTR is the CESTR difference between two pH compartments, and α is CESTR standard deviation of each pH compartment.

Figure 7A:
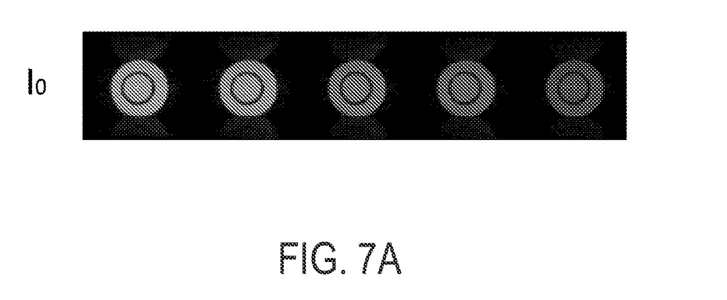
FIG. 7A provides a series of images acquired using techniques of the present invention and illustrating decays with respect to TE.
Figure 7B:
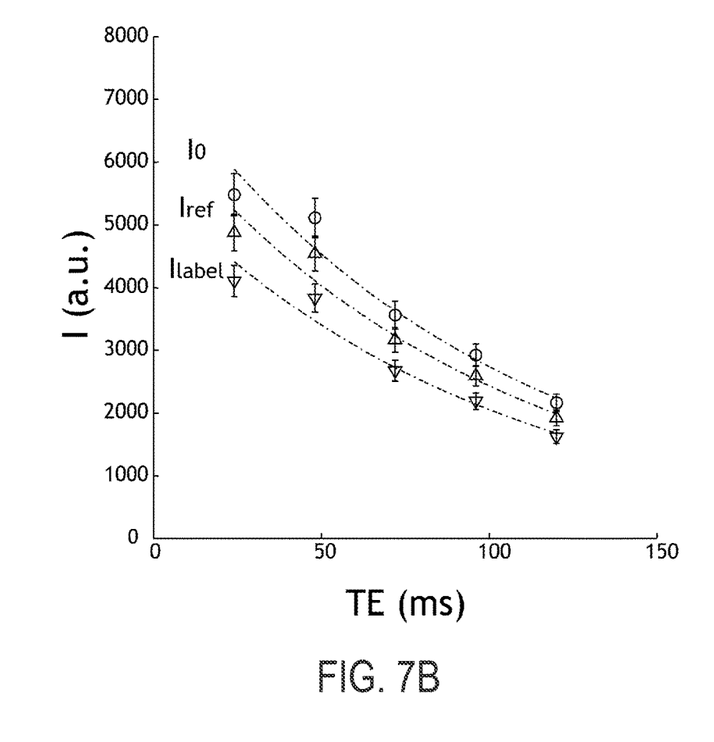
FIG. 7B is a graph showing the decay rates for control, reference, and labels images with respect to echo time described by $T_2$ relaxation.

T1 and T2 maps showed very small change with pH. Specifically, T1 was 2.76±0.05 s and 2.71±0.05 s for pH compartments of 6.5 and 6.0, respectively. In addition, T2 was found to be 79.9±2.1 ms and 81.7±3.4 ms, respectively. FIG. 7A is a series of control images of meCEST MRI, whose intensity decayed with the number of echo (i.e., TE) due to $T_2$ relaxation. FIG. 7B is a graph showing TE-dependent signals ($I_0$, $I_{ref}$, and $I_{label}$) of the inner pH compartment (i.e., pH=6.5). The reference images were persistently lower than the control image due to direct RF saturation. In addition, CEST label images were significantly lower than reference images, evidencing the pH-sensitive CEST effect. Indeed, the decay of signal intensity with respect to echo time can be described by mono-exponential decay function (i.e., $I(TE)=I^*\exp(-TE/T_{2eff})$). $T_{2eff}$ was found to be 99.1, 99.1 and 99.4 ms for the control, reference and label images, respectively. The observation of nearly identical $T_{2eff}$ suggested that $T_2$-relaxation-induced signal decay should not affect CEST MRI contrast given the use of normalization of the asymmetry analysis. Notably, the mean $T_{2eff}$ derived from meCEST MRI was slightly longer than $T_2$ measured using the single spin echo MRI sequence (i.e., 79.9 ms). This is expected because CPMG multi-echo MRI can more effectively suppress $T_2^*$ and background gradient-induced signal loss.

Figure 8A:
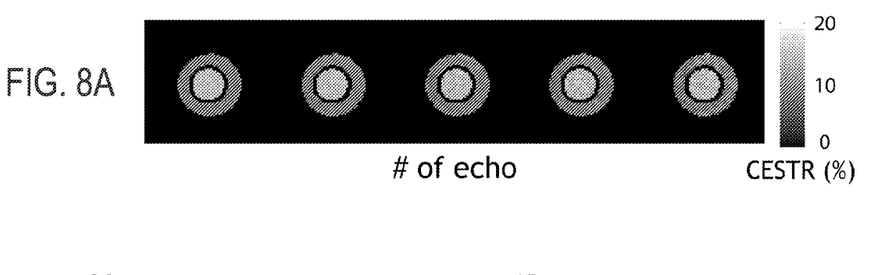
FIG. 8A is a set of CEST-weighted images from each spin echo acquired in accordance with the present invention.
Figure 8B:
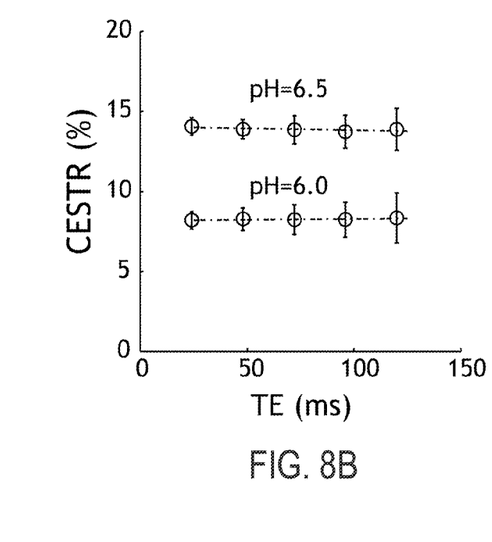
FIG. 8B is a graph illustrating that CEST effect shows little change with TE.
Figure 8C:
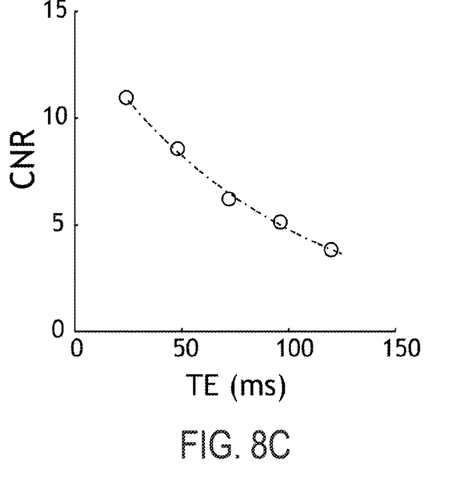
FIG. 8C is a graph illustrating the CNR between two pH compartments decays with TE due to $T_2$-induced signal loss.

FIG. 8A shows multiple CEST images calculated from each echo of meCEST MRI (i.e. CESTR(i)=$(I_{ref}(i)-I_{label}(i))/I_0(i)$), with i being the echo number. The magnetic field homogeneity was −1.8±1.4 Hz within the slice. Given the satisfactory field inhomogeneity, no field correction was necessary in this study. Because control, reference, and label images all decay by the same rate, CESTR showed very little change with TE, as illustrated in FIG. 8B. Specifically, CESTR as a function of echo time can be described by linear regression as CESTR(TE)=14.0−2.2*$10^{-3}$×TE % and CESTR(TE)=8.2+1*$10^{-3}$×TE % for pH compartment of 6.5 and 6.0, respectively, as illustrated in FIG. 8B. There was no significant correlation between CESTR and TE (P>0.15), for both pH compartments. However, the standard deviation of CEST effect increased over TE due to $T_2$-induced signal decay. Indeed, whereas the contrast between the two pH compartments was independent of TE, being ΔCESTR=5.9−3.2*$10^{-5}$*TE %, FIG. 8B, its CNR decays with TE with an effective time constant of 92 ms (FIG. 8C).

Figure 9A:
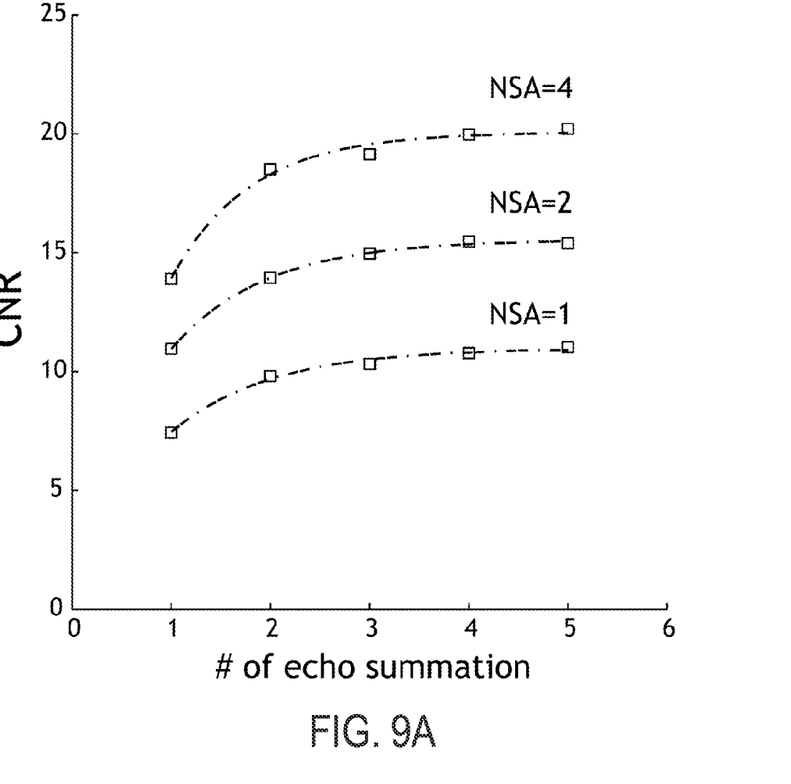
FIG. 9A is a graph created to evaluate sensitivity enhancement with the meCEST MRI technique of the present invention and showing that CNR can be significantly enhanced with least-squares optimization from meCEST MRI, modulated based on normalized $T_2$ decay coefficient

Referring to FIG. 9A, evaluation of sensitivity enhancement with the meCEST MRI technique of the present invention shows that CNR can be significantly enhanced with least-squares optimization from meCEST MRI, modulated based on their normalized T2 decay coefficient. Specifically, CESTR maps up to ith echo were superimposed based on their normalized $T_2$ decay coefficient $$\text{i.e.} \left( \frac{\sum_{i=1}^{N} e^{-TE_i/T_2} * CESTR_i}{\sum_{i=1}^{N} e^{-TE_i/T_2}} \right).$$

Note that T2-based normalization factor is equivalent to that using image intensity $$\text{i.e.} \left( \frac{\sum_{i=1}^{N} I_i * CESTR_i}{\sum_{i=1}^{N} I_i} \right).$$

The CNR for CESTR images was 11.0, 13.9, 15.0, 15.5 and 15.4 from the first echo alone, least-squares optimized superposition of CEST images from the first two, three, four and five echoes, respectively (NSA=2). It is noted that CNR plateaued when superimposing the first five images, with CNR 41% higher than the conventional single echo CEST-EPI image. In addition, varying NSA from 1, 2 to 4 times and comparing with the CEST image SNR showed that an SNR gain obtained from meCEST MRI is approximately equivalent to that obtained by doubling the number of signal averaging, as illustrated in FIG. 9A.

Figure 9B:
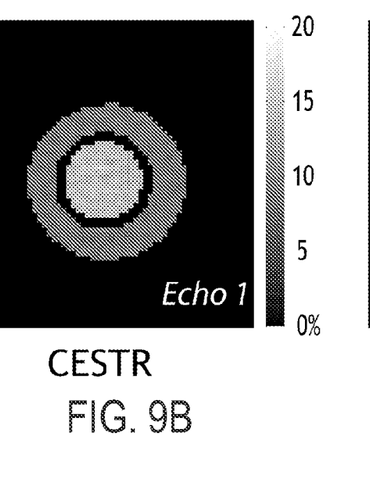
FIG. 9B is a CEST image reconstructed from first echo acquired using techniques of the present invention.
Figure 9C:
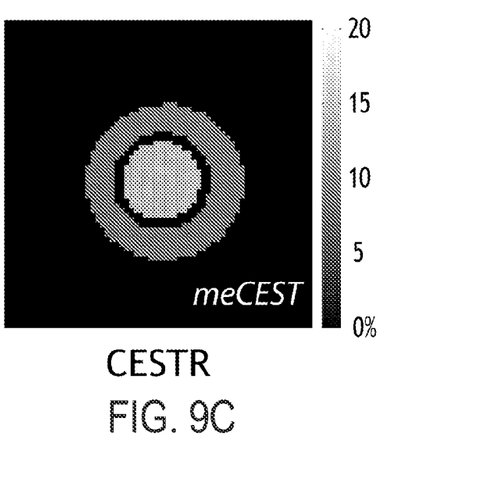
FIG. 9C is a CEST image acquired using techniques of the present invention and calculated from least-squares optimized meCEST MRI in accordance with the present invention.

Referring to FIG. 9B, CEST maps were obtained from the least-squares optimized meCEST MRI (NSA=2) and evaluated. For the single echo CEST-EPI map, CESTR was 14.1±0.5% and 8.2±0.5% for the pH compartment of 6.5 and 6.0, respectively. In comparison, referring to FIG. 9C, the CEST effect was 13.9±0.3% and 8.3±0.4% from least squares optimization of the first five echoes obtained using the proposed meCEST MRI. The SNR was increased from 11.0 to 15.4.

The foregoing demonstrates that meCEST MRI provides CEST measurements at significantly improved sensitivity over other methods. To minimize $T_2$-induced signal loss, the study chose a relatively large EPI acquisition bandwidth of 225 kHz, with TE being multiples of 24 ms. Multi-shot EPI acquisition may also reduce the echo time. However, in doing so the scan time will be prolonged, resulting in a loss of CNR per unit time. In addition, the echo time can be further shortened with acquisition strategies, such as parallel acceleration and compressed sensing. Moreover, $T_2$ is strongly field dependent, which is longer at lower field strength. Therefore, $T_2$-induced signal attenuation is mitigated at the commonly used clinical field strength, such as 1.5 and 3 Tesla, which may further enhance the sensitivity gain of the proposed meCEST MRI. Such improvement is important for cases where the CEST effect is relatively small, such as modified in vivo APT MRI sequences, including frequency-labeled exchange (FLEX), chemical exchange rotation transfer (CERT) and saturation with frequency alternating RF irradiation (SAFARI), as described in Friedman J I, McMahon M T, Stivers J T, Van ZijI P C M. Indirect Detection of Labile Solute Proton Spectra via the Water Signal Using Frequency-Labeled Exchange (FLEX) Transfer. J Am Chem Soc 2010; 132(6):1813-1815, Zu Z, Janve V A, Li K, Does M D, Gore J C, Gochberg D F. Multi-angle ratiometric approach to measure chemical exchange in amide proton transfer imaging. Magn Reson Med 2012; 68(3):711-719 and Scheidegger R, Vinogradov E, Alsop D C. Amide proton transfer imaging with improved robustness to magnetic field inhomogeneity and magnetization transfer asymmetry using saturation with frequency alternating RF irradiation. Magn Reson Med 2011; 66(5): 1275-1285, which are incorporated herein by reference in their entirety. In addition, significant sensitivity enhancements provided by the present invention can be used with techniques focused on quantitative CEST (qCEST) analysis that aims to delineate labile proton ratio and exchange rate for improved characterization of the underlying CEST system, such as described in Dixon T W, Ren J, Lubag A, J. M., Ratnakar J, Vinogradov E, Hancu I, Lenkinski R, E., Sherry A D. A concentration-independent method to measure exchange rates in PARACEST agents. Magn Reson Med 2010; 63(3):625-632; Sun PZ. Simultaneous determination of labile proton concentration and exchange rate utilizing optimal RF power: radio frequency power (RFP) dependence of chemical exchange saturation transfer (CEST) MRI. J Magn Reson 2010; 202(2):155-161; Wu R, Liu C, Liu P, Sun P Z. Improved measurement of labile proton concentration-weighted chemical exchange rate (kws) with experimental factor-compensated and T1-normalized quantitative chemical exchange saturation transfer (CEST) MRI. Contrast Media & Molecular Imaging 2012; 7(4):384-389; and Desmond K L, Stanisz G J. Understanding quantitative pulsed CEST in the presence of MT. Magn Reson Med 2012; 67(4):979-990, which are incorporated herein by reference in their entirety. Moreover, meCEST MRI sequence is applicable for the semisolid magnetization transfer (MT) and arterial spin labeling (ASL) MRI due to the use of normalization calculation that compensates the relaxation-induced multi-echo signal change. In addition, the multi-echo acquisition strategy and sensitivity enhancement processing approach can be extended for diffusion and kurtosis MRI.

Thus, the present invention can be combined with segmented RF irradiation scheme that includes a long RF irradiation pulse to obtain the steady state CEST effect, followed by multiple short RF labeling pulses for signal averaging and multi-slice acquisition. Previously, in order not to disturb the steady state CEST effect, gradient echo EPI may be applied, which is susceptible to field inhomogeneity-induced distortion. Both image distortion and sensitivity can be effectively addressed by combining the proposed meCEST MRI sequence with segmented RF irradiation scheme. Whereas the CPMG multi-echo EPI may be susceptible to stimulated echo artifacts due to field inhomogeneity, as detailed below, studies showed that high-order gradient shimming and volume RF transmitter should be sufficient to minimize such potential artifacts. In addition, $T_2$ can be derived from meCEST MRI, similar as the routine multi-echo sequence. EPI images were reconstructed per echo time and the magnitude images were used for least square optimization. Because the SNR of the raw images was relatively high, and the asymmetry analysis calculated the difference between the normalized reference and label images, the Rician noise can be approximated by Gaussian noise to yield a sensitivity gain despite the use of the magnitude images. This can be improved by taking into account of the phase information.

The foregoing demonstrated that CEST images derived using meCEST MRI in accordance with the present invention were independent of echo time. A significant sensitivity gain can be achieved with least-squares optimization over the conventional single echo CEST-EPI sequence. In summary, the meCEST MRI technique of the present invention provides a novel and sensitive acquisition strategy for CEST imaging, which provides various advantages not previously available.

The present invention has been described in terms of one or more embodiments, and it should be appreciated that many equivalents, alternatives, variations, and modifications, aside from those expressly stated, are possible and within the scope of the invention. For example, it is contemplated that the above-described techniques may be used to perform multi-echo CEST-spectroscopy. The process for multi-echo CEST-spectroscopy is based on the same principles described above, except no spatial encoding is performed with acquiring the data.

The invention claimed is:

1. A magnetic resonance imaging (MRI) system comprising:
   a magnet system configured to generate a polarizing magnetic field about at least a region of interest (ROI) in a subject arranged in the MRI system;
   a plurality of gradient coils configured to apply a gradient field to the polarizing magnetic field;
   a radio frequency (RF) system configured to apply an excitation field to the subject and acquire MR image data from a ROI;
   a computer system programmed to:
      control the RF system and plurality of gradient coils to perform a first pulse sequence that saturates a selected labile spin species of the subject by applying a radiofrequency (RF) irradiation at a reference frequency;
      control the RF system and plurality of gradient coils to perform a multi-echo spin echo pulse sequence that saturates a selected labile spin species of the subject by applying an RF irradiation at a labeling frequency;
      control the RF system and plurality of gradient coils to perform a multi echo-planar imaging (EPI) acquisition to acquire a plurality of echoes having information pertaining to at least one of metabolites and metabolite byproducts within the ROI to form a chemical exchange saturation transfer (CEST) medical imaging data set; and
      reconstruct the CEST medical imaging data set by combining a plurality of images generated from the plurality of echoes to form a CEST image of the subject including information about the at least one of metabolites and metabolite byproducts within the subject.

2. The MRI system of claim 1 wherein the computer system is further programmed to:
   reconstruct the CEST medical imaging data set by superimposing the plurality of images generated from the plurality of echoes to form the CEST image, wherein the plurality of images are normalized to a relaxation parameter.

3. The MRI system of claim 1 wherein the multi-echo spin echo pulse sequence includes a Carr Purcell Meiboom Gill (CPMG) multi-echo EPI.

4. The MRI system of claim 1 wherein the computer system is further programmed to:
   reconstruct the plurality of images from the CEST medical imaging data set, wherein each of the plurality of images corresponds to one of the plurality of echoes; and
   perform at least one of a least-squares analysis and an alternative optimized weighting function to superimpose the plurality of images to control contrast to noise in the CEST image.

5. The MRI system of claim 4 wherein the at least one of the least-squares algorithm and the alternative optimized weighting function includes modulation based on normalized T2 decay coefficient across the plurality of echoes.

6. The MRI system of claim 1 wherein the computer system is further programmed to control the RF system and the plurality of gradient coils to acquire reference image data and reconstruct a reference image from the reference image data.

7. The MRI system of claim 6 wherein the computer system is further programmed to subtract the CEST image form the reference image to create a corrected ratio image corrected for relaxation-induced losses by recovering saturation of the selected labile spin species.

8. The MRI system of claim 7 wherein the computer system is further programmed to control the RF system and the plurality of gradient coils to acquire signal data indicative of a relaxation parameter and produce, from the signal data, a relaxation parameter image.

9. The MRI system of claim 8 wherein the computer system is further programmed to produce a first ratio image from the reconstructed reference and the labeled images.

10. The MRI system of claim 9 wherein the corrected ratio image is produced by multiplying voxel values in the first ratio image by corresponding voxel values in the relaxation parameter image.

11. The MRI system of claim 8 wherein the relaxation parameter is a longitudinal relaxation rate.

12. The MRI system of claim 1 wherein computer system is further programmed to apply RF irradiation as one of a continuous wave RF irradiation and a series of RF pulses.

13. The MRI system of claim 1 wherein the selected labile spin species includes at least one of exchangeable protons and hyperpolarized nuclei.

14. A method for producing a report regarding a subject using a magnetic resonance imaging (MRI) system, the method comprising the steps of:
   performing, with the MRI system, a first pulse sequence that saturates a selected labile spin species of the subject by applying a radiofrequency (RF) irradiation at a reference frequency;
   performing, with the MRI system, a multi-echo spin echo pulse sequence that saturates a selected labile spin species of the subject by applying an RF irradiation at a labeling frequency;
   performing a multi echo-planar imaging (EPI) acquisition to acquire, with the MRI system, a plurality of echoes having information pertaining to at least one of metabolites and metabolite byproducts within the ROI to form a chemical exchange saturation transfer (CEST) data set; and reconstruct the CEST medical imaging data set by combining a plurality of images generated from the plurality of echoes to generate a spectroscopy report from the CEST data set including information about the at least one of metabolites and metabolite byproducts within the subject.

* * * * *